United States Patent
Wang et al.

(10) Patent No.: US 7,417,452 B1
(45) Date of Patent: Aug. 26, 2008

(54) TECHNIQUES FOR PROVIDING ADJUSTABLE ON-CHIP TERMINATION IMPEDANCE

(75) Inventors: Xiaobao Wang, Cupertino, CA (US); Chiakang Sung, Milpitas, CA (US); Khai Q. Nguyen, San Jose, CA (US); Sanjay K. Charagulla, San Jose, CA (US)

(73) Assignee: Altera Corporation, San Jose, CA (US)

( * ) Notice: Subject to any disclaimer, the term of this patent is extended or adjusted under 35 U.S.C. 154(b) by 13 days.

(21) Appl. No.: 11/462,702

(22) Filed: Aug. 5, 2006

(51) Int. Cl.
  *H03K 17/16* (2006.01)
  *H03K 19/003* (2006.01)
(52) U.S. Cl. .............................. 326/30; 326/86; 326/87
(58) Field of Classification Search ................. 326/30, 326/82–83, 86–87
  See application file for complete search history.

(56) References Cited

U.S. PATENT DOCUMENTS

| | | | |
|---|---|---|---|
| 4,719,369 A | 1/1988 | Asano et al. | |
| 5,134,311 A | 7/1992 | Biber et al. | |
| 5,559,448 A | 9/1996 | Koenig | |
| 5,764,080 A | 6/1998 | Huang et al. | |
| 5,955,911 A | 9/1999 | Drost et al. | |
| 6,064,224 A * | 5/2000 | Esch et al. | 326/30 |
| 6,118,310 A | 9/2000 | Esch et al. | |
| 6,366,128 B1 | 4/2002 | Ghia et al. | |
| 6,433,579 B1 | 8/2002 | Wang et al. | |
| 6,445,245 B1 | 9/2002 | Schultz et al. | |
| 6,489,837 B2 | 12/2002 | Schultz et al. | |
| 6,535,047 B2 * | 3/2003 | Mughal et al. | 327/378 |
| 6,586,964 B1 | 7/2003 | Kent et al. | |
| 6,590,413 B1 | 7/2003 | Yang | |
| 6,603,329 B1 | 8/2003 | Wang et al. | |
| 6,605,958 B2 * | 8/2003 | Bergman et al. | 326/30 |
| 6,798,237 B1 | 9/2004 | Wang et al. | |
| 6,812,732 B1 | 11/2004 | Bui et al. | |
| 6,812,734 B1 | 11/2004 | Shumarayev et al. | |
| 6,836,144 B1 | 12/2004 | Bui et al. | |
| 6,888,369 B1 | 5/2005 | Wang et al. | |
| 6,888,370 B1 | 5/2005 | Luo et al. | |
| 6,980,022 B1 | 12/2005 | Shumarayev et al. | |
| 7,038,485 B2 * | 5/2006 | Nakashima et al. | 326/30 |
| 7,084,662 B1 * | 8/2006 | Om et al. | 326/30 |
| 7,193,431 B2 * | 3/2007 | Miyake et al. | 326/30 |

(Continued)

OTHER PUBLICATIONS

"Virtex-II Pro and Virtex-II Pro X FPGA User Guide," Mar. 23, 2005, pp. 223-240.

(Continued)

*Primary Examiner*—Rexford Barnie
*Assistant Examiner*—Jason M Crawford
(74) *Attorney, Agent, or Firm*—Steven J. Cahill

(57) ABSTRACT

Techniques are provided for individually adjusting the on-chip termination impedance that is generated by input and output (IO) buffers in an input/output (IO) bank on an integrated circuit. The IO buffers in an IO bank can generate different on-chip termination impedances. And as a result, an IO bank can support more than one class of memory interfaces. An OCT calibration block generates a digital on-chip termination (OCT) calibration code. In some embodiments, circuitry in the IO banks can be configured to shift the OCT calibration code by one or more bits to adjust the series and/or parallel on-chip termination impedance in one or more IO buffers.

25 Claims, 9 Drawing Sheets

U.S. PATENT DOCUMENTS

| | | | |
|---|---|---|---|
| 7,239,171 | B1 | 7/2007 | Wang et al. |
| 2002/0101278 | A1 | 8/2002 | Schultz et al. |
| 2004/0008054 | A1* | 1/2004 | Lesea et al. .................. 326/30 |
| 2005/0012533 | A1* | 1/2005 | Aoyama et al. ............. 327/170 |
| 2007/0236247 | A1* | 10/2007 | Wang et al. .................. 326/30 |
| 2008/0048714 | A1* | 2/2008 | Lee et al. ..................... 326/30 |

OTHER PUBLICATIONS

"Stratix II Device Handbook, vol. 2: 4. Selectable I/O Standards in Stratix II & Stratix II GX Devices," Altera Corporation, Dec. 2005, pp. 4-1 through 4-42.

"Virtex-4 User Guide," Mar. 21, 2006.

* cited by examiner

TECHNIQUES FOR PROVIDING ADJUSTABLE ON-CHIP TERMINATION IMPEDANCE

BACKGROUND OF THE INVENTION

The present invention relates to on-chip termination impedance, and more particularly, to techniques for providing adjustable on-chip termination impedance on integrated circuits.

Signal reflection can occur on transmission lines when there is a mismatch between the impedance of the transmission line and the impedance of the transmitter and/or receiver. The reflected signal can interfere with the transmitted signal, causing distortion and degrading signal integrity.

To solve this problem, transmission lines are resistively terminated by a matching impedance to minimize or eliminate signal reflection. Input/output (IO) pins on an integrated circuit package are often terminated by coupling external termination resistors to the appropriate IO pins. However, many integrated circuit packages require a large number of termination resistors, because they have a large number of IO pins. Therefore, it is becoming more common to resistively terminate transmission lines using on-chip termination (OCT) to reduce the number of external components.

The Stratix® II field programmable gate array (FPGA) made by Altera, Corporation of San Jose, Calif. has calibrated on-chip termination to support a wide range of high-speed memory interfaces in a single device. Because different memory interfaces require different power supply voltages, input and output buffers are arranged in input/output (IO) banks in order to support memory interfaces flexibly. Each bank has its own power supply independent of other IO banks. Buffers within the same IO bank share the same power supply. Calibrated on-chip source (series) termination (Rs) and parallel termination (Rt) are supported in some of the IO banks to achieve higher memory interface performance.

In the Stratix II FPGA, one calibration circuit controls the on-chip termination impedance in an IO bank, and all of the buffers in the IO bank have the same termination impedance at any particular time. However, class I and Class II memory interfaces typically require different series and parallel termination impedance values. As a result, one IO bank cannot support both class I and class II memory interfaces.

Therefore, it would be desirable to provide techniques for supporting multiple classes of memory interfaces in the same IO bank on an integrated circuit.

BRIEF SUMMARY OF THE INVENTION

The present invention provides techniques for individually adjusting the on-chip termination impedance generated by input and output buffers in an IO bank on an integrated circuit. The buffers in an IO bank can generate different on-chip termination impedance values, and as a result, an IO bank of the present invention can support more than one class of memory interfaces.

An OCT calibration circuit block generates a digital on-chip termination (OCT) calibration code. In some embodiments of the present invention, circuitry in the IO banks is configured to shift the OCT calibration code by one or more bits to adjust the series and/or parallel on-chip termination impedance in one or more input/output buffers.

Other objects, features, and advantages of the present invention will become apparent upon consideration of the following detailed description and the accompanying drawings.

DETAILED DESCRIPTION OF THE INVENTION

Figure 1:
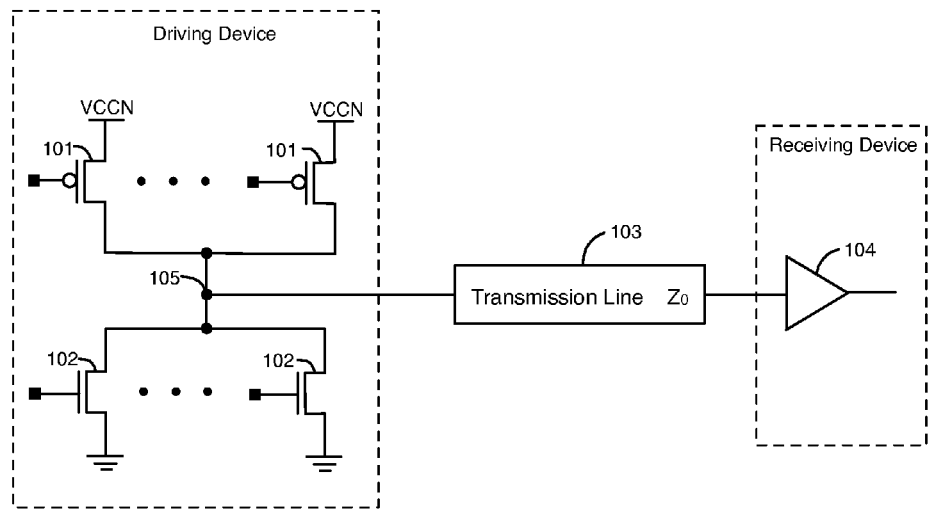
FIG. 1 illustrates an on-chip termination circuit that provides source (series) termination impedance to a transmission line.

FIG. 1 illustrates an on-chip termination circuit that provides source (series) termination impedance to a transmission line 103. A driving device drives signals along a transmission line 103 to a receiving circuit 104 in a receiving device. The driving device has on-chip drive transistors 101 and 102 that drive signals to transmission line 103. Drive transistors 101 can pull the voltage at an output pin 105 up to supply voltage VCCN, and drive transistors 102 can pull the voltage at the output pin 105 down to ground. Drive transistors 101 are not on at the same time as drive transistors 102. Transistors 101 and 102 are typically part of an output buffer.

Drive transistors 101 and 102 also provide series termination impedance to reduce signal reflection. Pull-up transistors 101 typically include multiple PMOS transistors coupled in parallel (e.g., 7). Pull-down transistors 102 typically include multiple NMOS transistors coupled in parallel (e.g., 7). The series on-chip termination impedance in the driving device can be varied by individually enabling a select number of transistors 101 and 102. For example, more current (and less termination resistance) can be provided to transmission line 103 by enabling more of transistors 101 and 102 or by enabling larger sized transistors.

Figure 2:
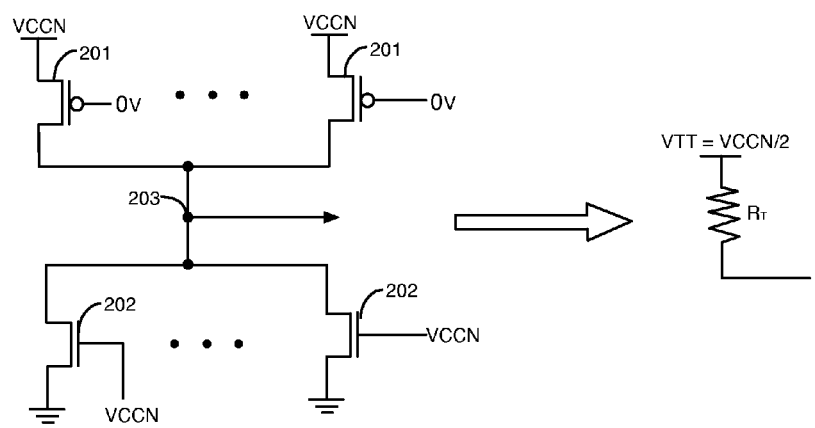
FIG. 2 illustrates an on-chip termination circuit that provides parallel termination impedance to a transmission line.

FIG. 2 illustrates an on-chip termination circuit that provides parallel termination impedance to a transmission line. Multiple pull-up PMOS transistors 201 are coupled in parallel to pin 203, and multiple pull-down NMOS transistors 202 are coupled in parallel to pin 203. The on-chip termination transistors 201/202 can be part of an input buffer or an output buffer.

Pull-up transistors 201 and pull-down transistors 202 are enabled simultaneously to form a Thevenin equivalent circuit Rt as shown in FIG. 2. The parallel on-chip termination resistance (Rt) can be any value. However, 50 Ohms is a typical value, because a typical transmission line impedance is 50 Ohms. Parallel on-chip termination (Rt) can be implemented using the same transistors as series on-chip termination (Rs) or using a different set of transistors.

Because a transistor current-to-voltage (I-V) curve is non-linear, and is usually in the saturation region when the drain-to-source voltage Vds=½*VCCN or above, the impedance of the transistor at Vds=VCCN is about twice the impedance at Vds=½*VCCN. A transistor is in saturation when the drain-to-source current (Ids) no longer increases with increasing Vds. Thus, the same PMOS and NMOS transistors with a particular calibrated series impedance (e.g., Rs=50 Ohm at Vds=½*VCCN) can be used to implement the same value for parallel termination impedance (e.g., Rt=50 Ohm).

Figure 3A:
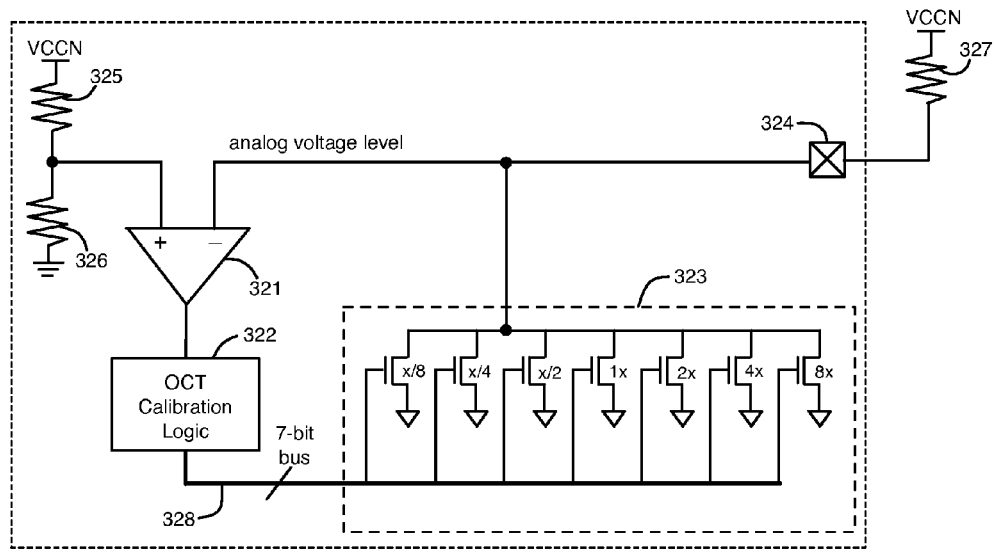
FIG. 3A illustrates a pull-down portion of an on-chip termination (OCT) calibration block that can be used to implement embodiments of the present invention.
Figure 3B:
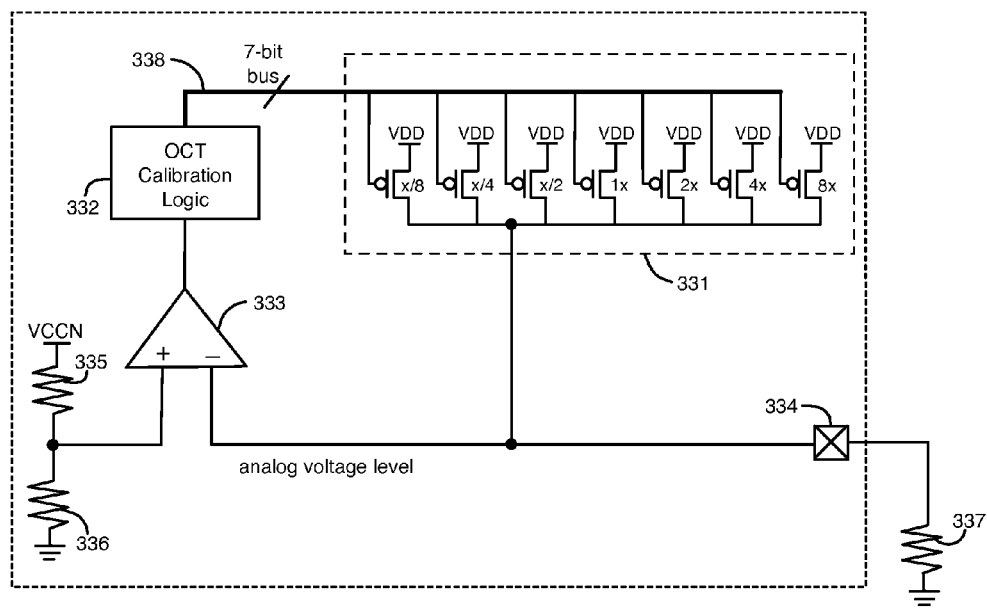
FIG. 3B illustrates a pull-up portion of an on-chip termination (OCT) calibration block that can be used to implement embodiments of the present invention.

An integrated circuit (IC) can have OCT calibration circuit blocks that generate OCT calibration codes for controlling the series and parallel on-chip termination impedance of input and output buffers. Details of an example implementation of an OCT calibration circuit block are shown and described with respect to FIGS. 3A-3B. Each OCT calibration circuit block typically has a set of pull-down transistors (NMOS) 323 as shown in FIG. 3A and a set of pull-up transistors (PMOS) 331 as shown in FIG. 3B (e.g., 7 transistors in each set). The set of pull-down transistors 323 are coupled together in parallel, and the set of pull-up transistors 331 are coupled together in parallel. Seven transistors 323 and seven transistors 331 are shown in FIGS. 3A-3B merely as an example. Any number of transistors 323 and 331 can be used.

The sizes, i.e. the width/length (W/L) channel ratios, of the transistors in the OCT calibration circuit block are binary-weighted. For example, the following ratios can be used to size the pull-up transistors as well as the pull-down transistors: 1/8×, 1/4×, 1/2×, 1×, 2×, 4×, 8×. The transistor with 1/8× size is the smallest, and the transistor with 8× size is the largest. Each transistor is individually turned on or off by a digital signal.

Referring to FIG. 3A, comparator 321 compares a reference voltage created by resistors 325 and 326 with the voltage at pin 324. Pin 324 is coupled to transistors 323 and external resistor 327. The output of comparator 321 is coupled to OCT calibration logic 322. OCT calibration logic 322 generates a digital NMOS OCT calibration code on 7-bit bus 328 in response to the output of comparator 321. The NMOS OCT calibration code on bus 328 selectively turns transistors 323 on or off.

Referring to FIG. 3B, comparator 333 compares a reference voltage created by resistors 335 and 336 with the voltage at pin 334. Pin 334 is coupled to transistors 331 and external resistor 337. The output of comparator 333 is coupled to OCT calibration logic 332. OCT calibration logic 332 generates a digital PMOS OCT calibration code on a 7-bit bus 338 in response to the output of comparator 333. The PMOS OCT calibration code selectively turns transistors 331 on or off.

After calibration is complete, the net impedance of transistors 331 is equal to or approximately equal to external resistor 337, and the net impedance of transistors 323 is equal to or approximately equal to external resistor 327. The OCT calibration codes on buses 328 and 338 are transmitted to IO banks where they are used to control the on-chip termination impedance in the IO buffers.

The NMOS OCT calibration code on bus 328 controls the net impedance of binary weighted, pull-down transistors in one or more input and/or output buffers. Thus, the NMOS OCT calibration code on bus 328 generates a pull-down on-chip termination impedance in one or more buffers that matches the resistance of resistor 327. The PMOS calibration code on bus 338 controls the net impedance of binary weighted, pull-up transistors in one or more input and/or output buffers. Thus, the PMOS calibration code on bus 338 generates a pull-up on-chip termination impedance in one or more buffers that matches the resistance of resistor 337. The OCT calibration process described with respect to FIGS. 3A-3B compensates for process, voltage, and temperature (PVT) variations on the integrated circuit.

Figure 4A:
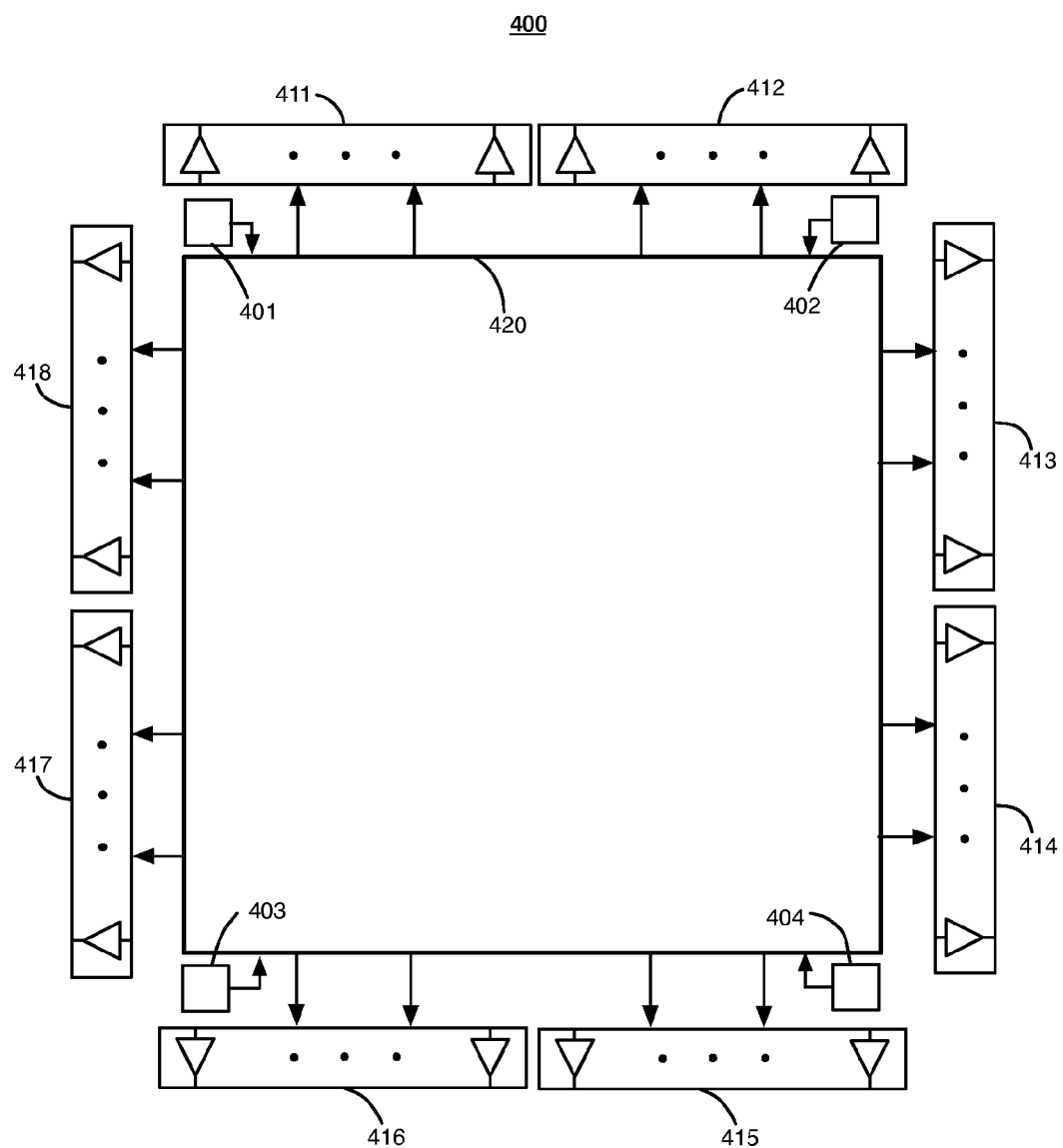
FIG. 4A illustrates an example of an integrated circuit having programmable IO banks that can implement embodiments of the present invention.

FIG. 4A illustrates an example of an integrated circuit (IC) 400 having programmable IO banks that can implement embodiments of the present invention. IC 400 is preferably a field programmable gate array or programmable logic device. However, IC 400 can also be an application specific integrated circuit (ASIC).

IC 400 has four OCT calibration circuit blocks 401-404. Four OCT calibration blocks 401-404 are shown in FIG. 4A for illustrative purposes. However, IC 400 can have any number of OCT calibration blocks (e.g., 8).

IC 400 has several IO banks, including IO banks 411-418. IC 400 can have any suitable number of IO banks. Eight IO banks 411-418 are shown in FIG. 4A for illustrative purposes. OCT calibration blocks 401-404 can transmit OCT calibration codes to any of the IO banks 411-418 along bus 420 (or another bus).

Each IO bank has multiple IO buffers. An IO buffer can be an input buffer, an output buffer, or both an input and an output buffer. Each of the IO buffers in an IO bank typically share the same power supply voltage. An IO buffer is typically coupled (directly or indirectly) to a pin of the IC.

Embodiments of the present invention provide the capability of simultaneously generating multiple on-chip termination impedance values in different IO buffers within a single IO bank. For example, the techniques of the present invention allow class I (50 Ohm Rs) and class II (25 Ohm Rs) memory interfaces to be supported in the same IO bank with only a negligible increase in the die size cost and circuit complexity. The present invention allows different memory interfaces to be implemented across different IO banks more efficiently, thus providing greater flexibility and the potential to greatly increase the IO bank utilizations.

The ability to support multiple values for the on-chip termination impedance in an IO bank is achieved by taking advantage of the binary weighted output transistors. As described above, each IO buffer has multiple binary weighted output transistors. The binary weighted output transistors have different W/L channel ratios, e.g., 1/8×, 1/4×, 1/2×, 1×, 2×, 4×, and 8×.

After the OCT calibration circuit block has finished calibration, an OCT calibration code is generated for controlling the conductive states of transistors in one or more input/output (IO) buffers. For example, if an OCT calibration code is [0101100], the first 0 from the left means the largest transistor (8×) is disabled, the second 1 from the left means the second largest transistor (4×) is enabled, etc. In order to decrease the series on-chip termination impedance from 50 Ohms to 25 Ohms, the total effective size (i.e., W/L channel ratio) of the enabled transistors is doubled by shifting the original OCT calibration code [0101100] to the left by one bit to get an OCT calibration code of [1011000].

The techniques of the present invention can be used to shift the OCT calibration output code to the right or to the left by one or more bits using circuitry in the IO banks. By locating the circuitry that performs the shifting function in the IO banks, an IO bank can use the same OCT calibration output code to generate different on-chip termination impedances at different pins. Thus, one IO bank can support multiple termination impedances at the same time. The present invention can have the benefit of reducing the number of OCT calibration blocks that are needed to support on-chip termination in the IO banks.

Figure 4B:
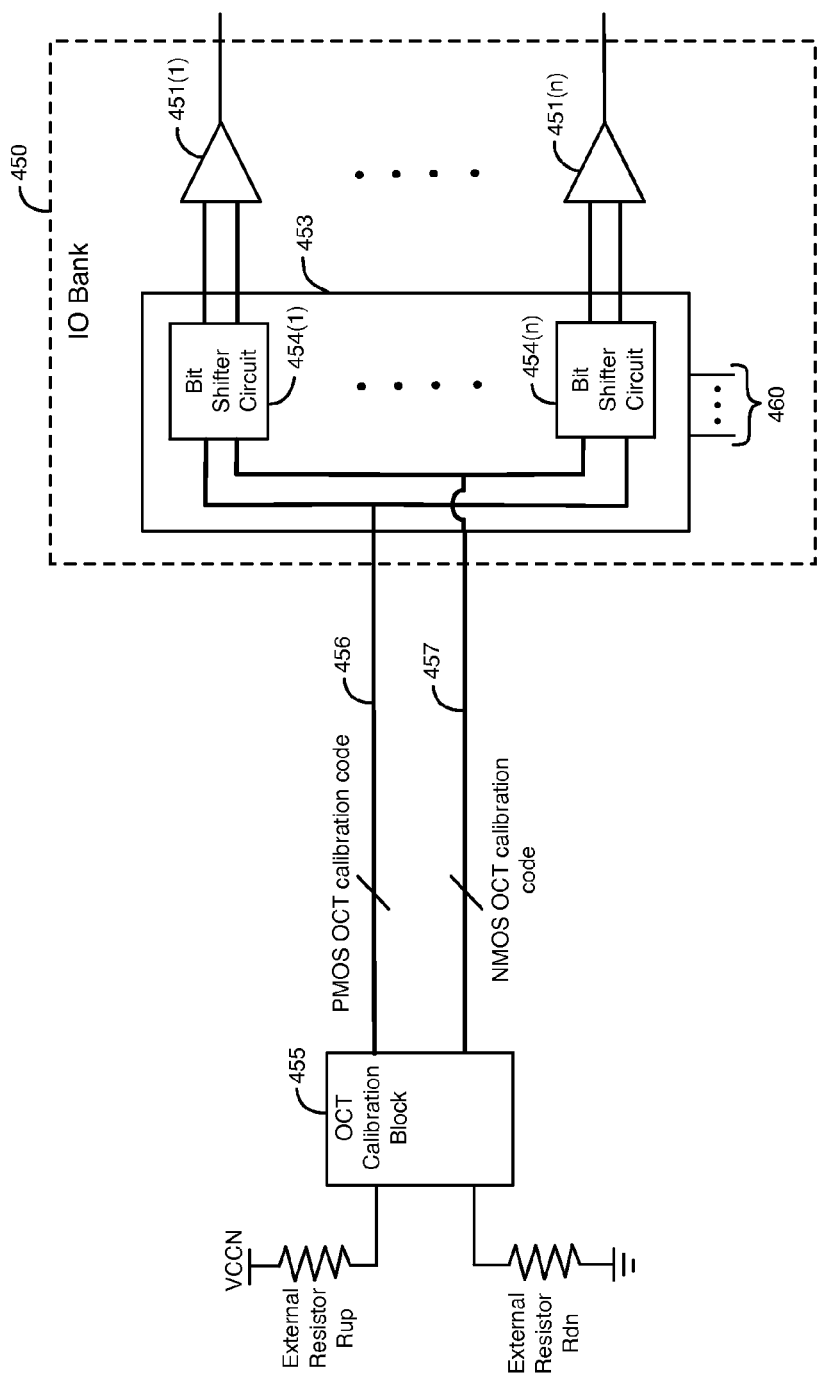
FIG. 4B is a top level diagram of a portion of an integrated circuit that includes an OCT calibration block and an IO bank having circuitry for selectively shifting an OCT calibration code, according to an embodiment of the present invention.

FIG. 4B is a top level diagram of a portion of an integrated circuit (IC) that includes an IO bank 450 and an OCT calibration circuit block 455, according to an embodiment of the present invention. The IC of FIG. 4B is preferably a field programmable gate array (FPGA) or a programmable logic device (PLD). However, IC 400 can also be an application specific integrated circuit (ASIC).

An FPGA typically contains multiple IO banks and multiple OCT calibration blocks as shown in FIG. 4A. However, only one OCT calibration block and one IO bank are shown in FIG. 4B to simplify the drawing.

The OCT calibration block 455 has one pin tied to an external reference resistor Rup (e.g., 50 Ohms) that is connected to the supply voltage (VCCN). OCT calibration block 455 has another pin tied to another external reference resistor Rdn (e.g., 50 Ohms) that is connected to ground (GND). The OCT calibration block 455 generates OCT calibration codes that are transmitted on two buses 456-457. Bus 456 transmits the PMOS OCT calibration code that controls the pull-up PMOS transistors. Bus 457 transmits the NMOS OCT calibration code that controls the pull-down NMOS transistors. Buses 456-457 have enough wires to transmit each of the signals in the OCT calibration codes (e.g., 7 PMOS signals and 7 NMOS signals).

Each IO bank typically contains multiple input and output buffers. IO bank 450, for example, has n number of input and/or output buffers 451(1)-451(n). Each input and output buffer 451 in bank 450 has pull-up and pull-down transistors that provide series and/or parallel on-chip termination impedance at a pin. The PMOS calibration code from bus 456 is used to control the termination impedance of the pull-up transistors in the buffers, and the NMOS calibration code from bus 457 is used to control the termination impedance of the pull-down transistors in the buffers.

IO bank 450 contains selector block 453 for selecting on-chip termination impedance values for the individual IO buffers 451. Selector block 453 includes a number (n) of bit shifter circuits 454(1)-454(n). Block 453 receives a set of bit shift control signals 460 (e.g., CRAM bits in an FPGA). Each bit shifter circuit 454 is configured to shift the OCT calibration codes from buses 456-57 by one (or more) bits in response to one (or more) of the bit shift control signals 460. The bit shifted OCT calibration codes generated by each bit shifter circuit 454 are provided to one (or more) of the IO buffers 451.

A unique bit shift signal 460 is received at each bit shifter circuit 454. Each control signal 460 controls the termination impedance in one of the buffers 451. Thus, the termination impedance of each buffer 451 in bank 450 can be controlled independently of the other buffers 451 in the bank. For example, the OCT calibration codes can be shifted for a first IO buffer 451(1) in bank 450, and at the same time, the OCT calibration codes can remain the same (i.e., not shifted) for a second IO buffer 451(2) in bank 450.

A specific example is now provided as an illustration. If a first one of the control signals 460 is high, a bit shifter circuit shifts the OCT calibration codes by one bit, and a corresponding IO buffer resistance is 25 Ohm. If the first control signal 460 is low, the OCT calibration codes are not shifted, and the corresponding IO buffer resistance is 50 Ohms.

According to some embodiments of the present invention, calibrated series and parallel on-chip termination is supported in each IO bank and in some or all of the IO buffers. In some instances, the transistors that provide series termination impedance at an IO buffer can also be configured to provide parallel termination impedance at a different time. Alternatively, the transistors that support series termination impedance in an IO buffer can be different from the transistors that support parallel termination impedance in the buffer.

In some embodiments of the present invention, the parallel termination feature can be disabled in one or more of the IO buffers, and the series termination impedance can be selected to be one of two different values. For example, a CRAM bit ROCT[1] can be used to enable or disable the parallel on-chip termination (Rt) in an IO buffer, and a CRAM bit ROCT[0] can be used to control whether the series on-chip termination impedance (Rs) in the IO buffer is one of two values, e.g., either 25 Ohms or 50 Ohms. Table 1 illustrates an example of this embodiment of the present invention, where Rup and Rdn are external resistors coupled to the OCT calibration block.

TABLE 1

| | | OCT Support | |
|---|---|---|---|
| ROCT[1:0] | Rup/Rdn (Ω) | Rs (Ω) | Rt (Ω) |
| 00 | 50 | 50 | No |
| 01 | 50 | 25 | No |
| 10 | 50 | 50 | 50 |
| 11 | 50 | 25 | 50 |

Using the techniques described above with respect to FIG. 4B, the series on-chip termination impedance in an IO buffer can be individually selected to be one of two (or more) different impedance values for any particular off-chip resistor value. The parallel on-chip termination impedance in an IO buffer can also be individually selected to be one of two (or more) different impedance values for any particular off-chip resistor value. The parallel on-chip termination feature can be enabled or disabled.

The techniques of the present invention can be used to shift the OCT calibration code that is used to provide series on-chip termination or parallel on-chip termination impedance. For example, a bit shifter circuit 454 can shift the OCT calibration codes controlling the transistors in an IO buffer that provide series OCT impedance. Alternatively, a bit shifter circuit 454 can shift the OCT calibration code controlling the transistors in an IO buffer that provide parallel OCT impedance. In another embodiment, a bit shifter circuit 454 can shift an OCT calibration code that controls both the transistors in an IO buffer that provide series termination impedance and the transistors in the IO buffer that provide parallel termination impedance. As mentioned above, the transistors that provide series and parallel OCT impedance are the same transistors in some embodiments, and different transistors in other embodiments.

Figure 5A:
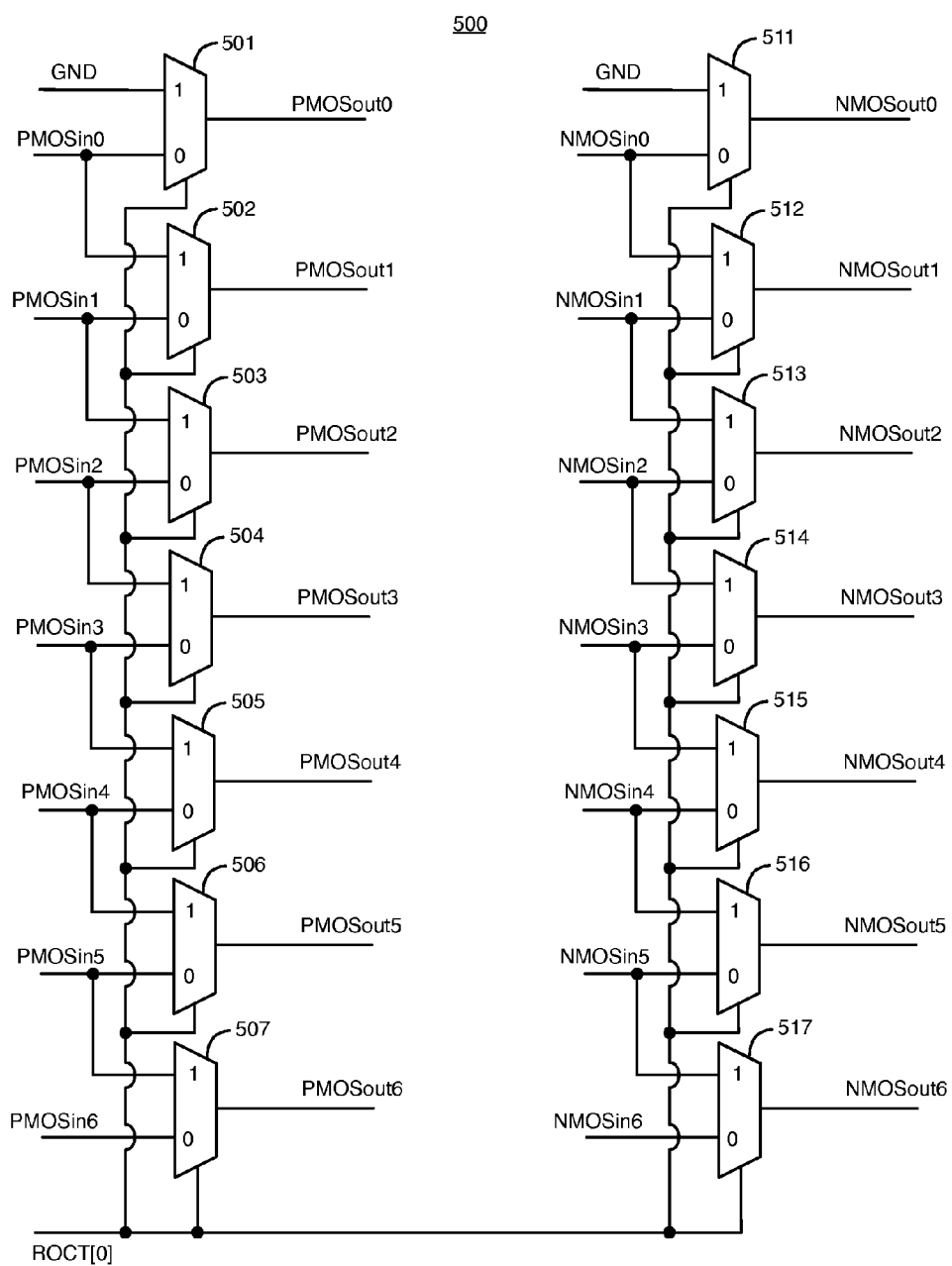
FIG. 5A illustrates a multiplexer block with 2-input multiplexers for shifting bits in an OCT calibration code, according to an embodiment of the present invention.

FIG. 5A illustrates a multiplexer block 500, according to an embodiment of the present invention. Multiplexer block 500 of FIG. 5A is a specific example of one or more of bit shifter circuits 454(1)-(n) of FIG. 4B. In some embodiments of the present invention, each bit shifter 454 includes a multiplexer block 500.

In multiplexer block 500, the OCT calibration codes are shifted by a set of 14 multiplexers 501-507 and 511-517 that are controlled by a CRAM bit ROCT[0]. Bus 456 transmits the PMOS OCT calibration code (PMOSin0-PMOSin6) to block 500. Bus 457 transmits the NMOS OCT calibration code (NMOSin0-NMOSin6) to block 500. The PMOS and NMOS calibration codes control the on-chip termination in one or more IO buffers.

Both PMOS and NMOS OCT calibration codes are controlled by the same ROCT[0] CRAM bit. When CRAM bit ROCT[0]=0, multiplexers 501-507 do not shift signals PMOSin0-PMOSin6. Multiplexer 501 couples PMOSin0 is to PMOSout0, multiplexer 502 couples PMOSin1 to PMOSout1, multiplexer 503 couples PMOSin2 to PMOSout2, multiplexer 504 couples PMOSin3 to PMOSout3, multiplexer 505 couples PMOSin4 to PMOSout4, multiplexer 506 couples PMOSin5 to PMOSout5, and multiplexer 507 couples PMOSin6 to PMOSout6.

Also, when CRAM bit ROCT[0]=0, multiplexers 511-517 do not shift signals NMOSin0-NMOSin6. Multiplexer 511 couples NMOSin0 is to NMOSout0, multiplexer 512 couples NMOSin1 to NMOSout1, multiplexer 513 couples NMOSin2 to NMOSout2, multiplexer 514 couples NMOSin3 to NMOSout3, multiplexer 515 couples NMOSin4 to NMOSout4, multiplexer 516 couples NMOSin5 to NMOSout5, and multiplexer 517 couples NMOSin6 to NMOSout6.

On the other hand, when CRAM bit ROCT[0]=1, multiplexers 501-507 shift signals PMOSin0-PMOSin6 by one bit to the left (or alternatively to the right). Multiplexer 501 couples a ground signal GND to PMOSout0, multiplexer 502 couples PMOSin0 to PMOSout1, multiplexer 503 couples PMOSin1 to PMOSout2, multiplexer 504 couples PMOSin2 to PMOSout3, multiplexer 505 couples PMOSin3 to PMOSout4, multiplexer 506 couples PMOSin4 to PMOSout5, and multiplexer 507 couples PMOSin5 to PMOSout6. PMOSin6 is not passed to the IO buffer.

Also, when CRAM bit ROCT[0]=1, multiplexers 511-517 shift signals NMOSin0-NMOSin6 by one bit to the left (or alternatively to the right). Multiplexer 511 couples a ground signal GND to NMOSout0, multiplexer 512 couples NMOSin0 to NMOSout1, multiplexer 513 couples NMOSin1 to NMOSout2, multiplexer 514 couples NMOSin2 to NMOSout3, multiplexer 515 couples NMOSin3 to NMOSout4, multiplexer 516 couples NMOSin4 to NMOSout5, and multiplexer 517 couples NMOSin5 to NMOSout6. NMOSin6 is not passed to the IO buffer.

Multiplexers 501-507 and 511-517 in multiplexer block 500 continuously couple the PMOS and NMOS OCT calibration codes to the IO buffer during the user mode of an FPGA. Because the OCT calibration block shown in and described with respect to FIGS. 3A-3B compensates for process, voltage, and temperature variations on the FPGA, multiplexer block 500 supports continuous calibration in user mode for tracking process, temperature, and voltage variations instantaneously.

Figure 5B:
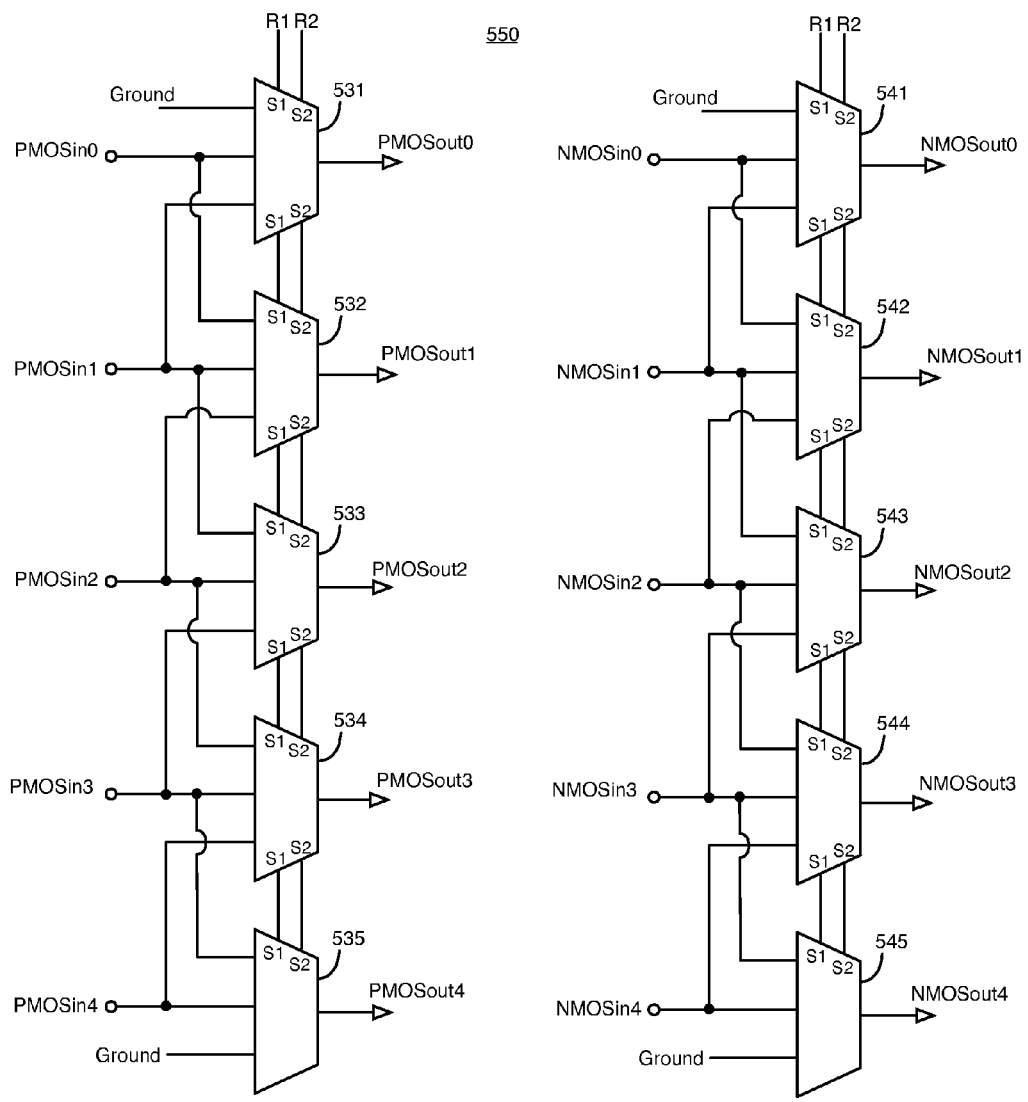
FIG. 5B illustrates a multiplexer block with 3-input multiplexers for shifting bits in an OCT calibration code, according to another embodiment of the present invention.

According to further embodiments of the present invention, a multiplexer block has 3-input (or more than 3-input) multiplexers that can shift bits in the OCT calibration codes to the left or to the right by one bit (or more than one bit). FIG. 5B illustrates an example of a multiplexer block 550 that contains 3-input multiplexers 531-535 and 541-545, according to a particular embodiment of the present invention. In some embodiments of the present invention, each bit shifter 454 includes a multiplexer block 550.

Multiplexers 531-535 receive a 5-bit PMOS OCT calibration code PMOSin0-PMOSin4, and multiplexers 541-545 receive a 5-bit NMOS OCT calibration code NMOSin0-NMOSin4. The multiplexers also receive a 2-bit digital control signal R1 and R2 at select terminals S1 and S2. The 2-bit control signal R1/R2 determines whether the multiplexers shift the PMOS and NMOS OCT calibration codes to the left or to the right by one bit. Control signal R1/R2 is an example of control signals 460 shown in FIG. 4B.

Input bit PMOSin1 is coupled to three multiplexers 531-533. Each of input bits PMOSin2-3 and NMOSin1-3 are also coupled to three of the multiplexers. Each of inputs bits PMOSin0, PMOSin4, NMOSin0, and NMOSin4 are coupled to two of the multiplexers. Multiplexers 531, 535, 541, and 545 each have one input coupled to ground. A specific example of an implementation of multiplexers 531-535 and 541-545 is shown in and described with respect to FIG. 7 in commonly assigned, co-pending U.S. patent application Ser. No. 10/798,597, filed Mar. 10, 2004, which is incorporated by reference herein.

An example of the bit shifting operation of FIG. 5B is now provided as an illustration and is not intended to limit the scope of the present invention. When R1/R2=10, an OCT calibration code of [01011] is shifted to the right to output [00101]. When R1/R2=01, the OCT calibration code [01011] is shifted to the left to output [10110]. The OCT calibration codes can be left shifted or right shifted using multiplexer block 550 to increase or decrease the size of the enabled transistors in an OCT circuit and its on-chip termination impedance.

Figure 6:
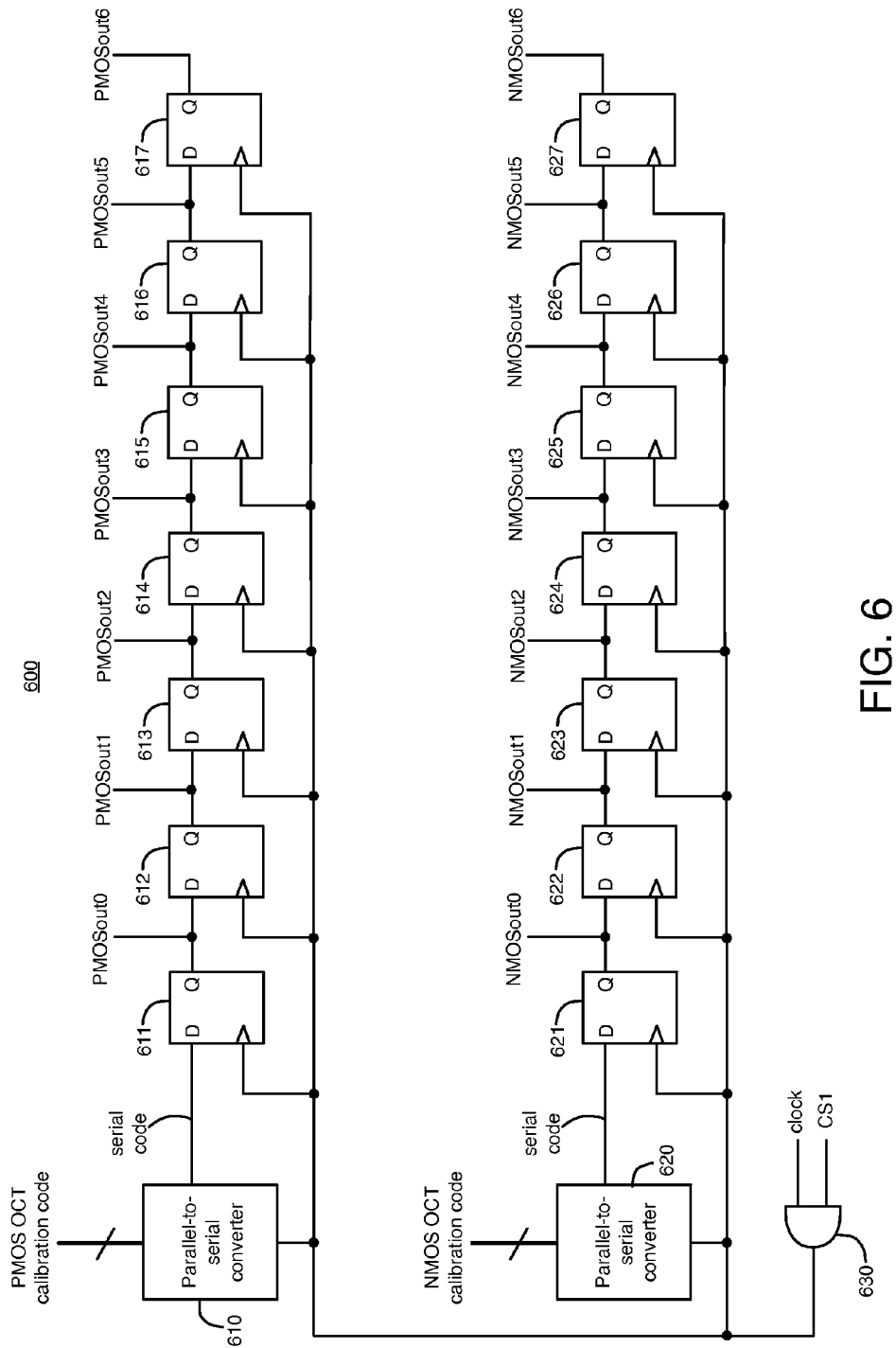
FIG. 6 illustrates a shift register block for shifting bits in an OCT calibration code, according to another embodiment of the present invention.

FIG. 6 illustrates shift register block 600, according to another embodiment of the present invention. Shift register block 600 is another example of one or more of bit shifter circuits 454(1)-(n) of FIG. 4B. In some embodiments of the present invention, each bit shifter 454 includes a shift register block 600.

Shift register block 600 includes two parallel-to-serial converters 610 and 620. Parallel-to-serial converter 610 receives the PMOS OCT calibration code in parallel from bus 456, and parallel-to-serial converter 620 receives the NMOS OCT calibration code in parallel from bus 457.

Shift register block 600 includes AND gate 630. AND gate 630 is coupled to receive a clock signal and a control signal CS1. Control signal CS1 is an example of one of the control signals 460 shown in FIG. 4B. Shift register block 600 also includes storage circuits 611-617 and 621-627. Storage circuits 611-617 and 621-627 can be, for example, D-flip-flips or D-latches. Each of the storage circuits has a clock input that is coupled to the output of AND gate 630.

Parallel-to-serial converter 610 converts the parallel PMOS calibration code into a serial code, and parallel-to-serial converter 620 converts the parallel NMOS calibration code into a serial code. Storage circuits 611-617 form a serial-to-parallel converter that receives the serial PMOS OCT calibration code and outputs a parallel OCT calibration code PMOSout0-PMOSout6. Storage circuits 621-627 form a serial-to-parallel converter that receives the serial NMOS OCT calibration code and outputs a parallel code NMOSout0-NMOSout6. Thus, the inputs and outputs of block 600 are parallel OCT calibration codes.

Block 600 is able to shift the OCT calibration codes left or right by one or more bits. Details of how block 600 provides a bit shifting function are now described. Initially, CS1 is low, and all of the Q outputs of storage units 611-617, 621-627 are cleared to logic low signals (e.g., via a reset signal).

When the control signal CS1 is high, the clock signal controls the shifting of the OCT calibration codes through parallel-to-serial converters 610 and 620 and storage circuits 611-617, 621-627. The first bit shifted out of converter 610 controls the largest PMOS transistor, and the first bit shifted out of converter 620 controls the largest NMOS transistor. Alternatively, the first bits shifted out of converters 610 and 620 can control the smallest PMOS and NMOS transistors.

After all of the OCT calibration bits have been shifted out of converters 610 and 620, converters 610 and 620 output logic low signals.

If the storage circuits 611-617, 621-627 are flip-flops, each of the flip-flops passes the calibration bit at its D input to its Q output on the rising edge of the clock signal. Thus, each rising edge of the clock signal causes the OCT calibration bits to be shifted forward through the flip-flops. When CS1 goes low, the flip-flops stop shifting the bits.

The PMOS and NMOS calibration codes can be shifted to the right or to the left using shift register block 600 by one or more bits. The period of time that CS1 is high and the number of clock signal periods that coincide with CS1 being high determines whether the OCT calibration codes are bit shifted, by how many bits they are shifted, and the direction of the shift. For example, the OCT calibration codes can be shifted by one bit in a first direction if CS1 is high for long enough to allow the second bit in each serial code to shift to the Q outputs of storage circuits 617 and 627. As another example, the OCT calibration codes can be shifted by one bit in the opposite direction if CS1 is only high for long enough to allow the first bit in each serial code to shift to the Q outputs of storage circuits 616 and 626.

Figure 7:
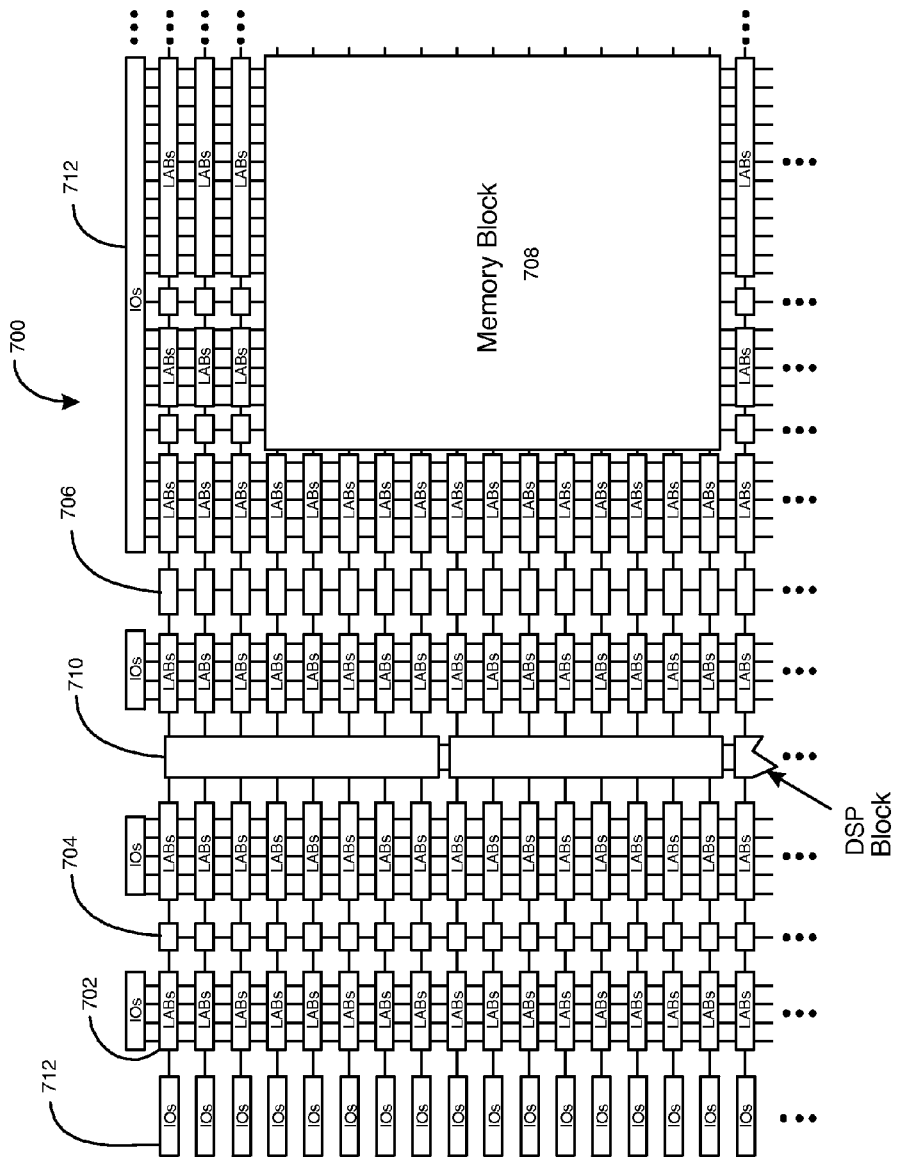
FIG. 7 is a simplified block diagram of a field programmable gate array that can embody the techniques of the present invention.

FIG. 7 is a simplified partial block diagram of an FPGA 700 that can include aspects of the present invention. FPGA 700 is merely one example of an integrated circuit that can include features of the present invention. It should be understood that the present invention can be applied to numerous types of integrated circuits such as field programmable gate arrays (FPGAs), programmable logic devices (PLDs), complex programmable logic devices (CPLDs), programmable logic arrays (PLAs), and application specific integrated circuits (ASICs).

FPGA 700 includes a two-dimensional array of programmable logic array blocks (or LABs) 702 that are interconnected by a network of column and row interconnect conductors of varying length and speed. LABs 702 include multiple (e.g., 10) logic elements (or LEs).

An LE is a programmable logic block that provides for efficient implementation of user defined logic functions. An FPGA has numerous logic elements that can be configured to implement various combinatorial and sequential functions. The logic elements have access to a programmable interconnect structure. The programmable interconnect structure can be programmed to interconnect the logic elements in almost any desired configuration.

FPGA 700 also includes a distributed memory structure including RAM blocks of varying sizes provided throughout the array. The RAM blocks include, for example, blocks 704, blocks 706, and block 708. These memory blocks can also include shift registers and FIFO buffers.

FPGA 700 further includes digital signal processing (DSP) blocks 710 that can implement, for example, multipliers with add or subtract features. IO blocks (IOs) 712 located, in this example, around the periphery of the chip support numerous single-ended and differential input/output standards. The IO blocks 712 contain IO buffers and are typically grouped into IO banks. It is to be understood that FPGA 700 is described herein for illustrative purposes only and that the present invention can be implemented in many different types of PLDs, FPGAs, and the like.

Figure 8:
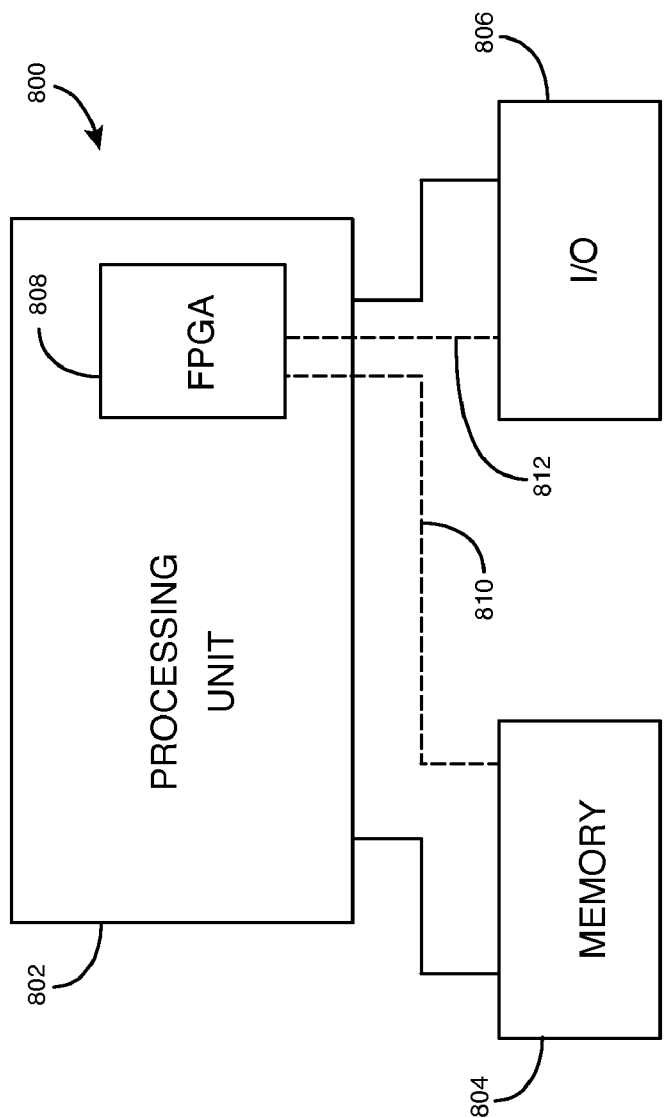
FIG. 8 is a block diagram of an electronic system that can implement embodiments of the present invention.

The present invention can also be implemented in a system that has an FPGA as one of several components. FIG. 8 shows a block diagram of an exemplary digital system 800 that can embody techniques of the present invention. System 800 can be a programmed digital computer system, digital signal processing system, specialized digital switching network, or other processing system. Moreover, such systems can be designed for a wide variety of applications such as telecommunications systems, automotive systems, control systems, consumer electronics, personal computers, Internet communications and networking, and others. Further, system 800 can be provided on a single board, on multiple boards, or within multiple enclosures.

System 800 includes a processing unit 802, a memory unit 804 and an I/O unit 806 interconnected together by one or more buses. According to this exemplary embodiment, an FPGA 808 is embedded in processing unit 802. FPGA 808 can serve many different purposes within the system in FIG. 8. FPGA 808 can, for example, be a logical building block of processing unit 802, supporting its internal and external operations. FPGA 808 is programmed to implement the logical functions necessary to carry on its particular role in system operation. FPGA 808 can be specially coupled to memory 804 through connection 810 and to I/O unit 806 through connection 812.

Processing unit 802 can direct data to an appropriate system component for processing or storage, execute a program stored in memory 804 or receive and transmit data via I/O unit 806, or other similar function. Processing unit 802 can be a central processing unit (CPU), microprocessor, floating point coprocessor, graphics coprocessor, hardware controller, microcontroller, field programmable gate array programmed for use as a controller, network controller, or any type of processor or controller. Furthermore, in many embodiments, there is often no need for a CPU.

For example, instead of a CPU, one or more FPGAs 808 can control the logical operations of the system. As another example, FPGA 808 acts as a reconfigurable processor, which can be reprogrammed as needed to handle a particular computing task. Alternately, FPGA 808 can itself include an embedded microprocessor. Memory unit 804 can be a random access memory (RAM), read only memory (ROM), fixed or flexible disk media, PC Card flash disk memory, tape, or any other storage means, or any combination of these storage means.

The foregoing description of the exemplary embodiments of the invention has been presented for the purposes of illustration and description. It is not intended to be exhaustive or to limit the invention to the precise form disclosed. A latitude of modification, various changes, and substitutions are intended in the present invention. In some instances, features of the invention can be employed without a corresponding use of other features as set forth. Many modifications and variations are possible in light of the above teachings, without departing from the scope of the invention. It is intended that the scope of the invention be limited not with this detailed description, but rather by the claims appended hereto.

What is claimed is:

1. An integrated circuit comprising:
    an input/output (IO) bank comprising a first buffer coupled to a first pin and a second buffer coupled to a second pin, wherein a first on-chip termination (OCT) calibration code controls on-chip termination impedances in the first and the second buffers, and the IO bank is configured to adjust the first OCT calibration code provided to the first buffer independently of the first OCT calibration code provided to the second buffer to generate different on-chip termination impedances in the first and the second buffers,
    wherein the first OCT calibration code controls the on-chip termination impedances of pull-up transistors in the first and the second buffers, a second on-chip termination calibration code controls on-chip termination impedances of pull-down transistors in the first and the second buffers, and the IO bank is configured to adjust the second OCT calibration code provided to the first buffer independently of the second OCT calibration code provided to the second buffer.

2. The integrated circuit defined in claim 1 wherein the IO bank further comprises a first bit shifter that is configured to shift all of the bits of the first OCT calibration code to generate a first bit shifted code for controlling the on-chip termination impedance in the first buffer, and the IO bank further comprises a second bit shifter that is configured to shift all of the bits of the first OCT calibration code to generate a second bit shifted code for controlling the on-chip termination impedance in the second buffer.

3. The integrated circuit defined in claim 1 wherein the IO bank further comprises a third buffer coupled to a third pin, wherein the IO bank is configured to adjust the first and the second OCT calibration codes provided to the third buffer independently of the first and the second OCT calibration codes provided to the first and the second buffers.

4. The integrated circuit defined in claim 1 wherein the IO bank further comprises a bit shifter circuit that adjusts the first OCT calibration code provided to the first and the second buffers.

5. The integrated circuit defined in claim 4 wherein the bit shifter circuit comprises a plurality of multiplexers.

6. The integrated circuit defined in claim 4 wherein the bit shifter circuit comprises a shift register circuit.

7. The integrated circuit defined in claim 1 wherein the IO banks control a series and a parallel termination impedance in response to the first OCT calibration code.

8. The integrated circuit defined in claim 1 wherein the integrated circuit is a field programmable gate array.

9. An integrated circuit comprising:
an on-chip termination calibration block that generates a first on-chip termination (OCT) calibration code; and
an input/output (IO) bank comprising a first buffer coupled to a first pin, a second buffer coupled to a second pin, a first bit shifter circuit configured to shift the first OCT calibration code to generate a first bit shifted code that controls a termination impedance provided by first pull-up transistors in the first buffer, and a second bit shifter circuit configured to shift the first OCT calibration code to generate a second bit shifted code that controls a termination impedance provided by second pull-up transistors in the second buffer, wherein the first and the second buffers share a same power supply voltage.

10. The integrated circuit defined in claim 9 wherein the first bit shifter circuit is a multiplexer block that comprises a plurality of multiplexer circuits coupled to receive the first OCT calibration code.

11. The integrated circuit defined in claim 10 wherein the multiplexer block comprises a plurality of 2-input multiplexer circuits coupled to receive the first OCT calibration code.

12. The integrated circuit defined in claim 10 wherein the multiplexer block comprises a plurality of 3-input multiplexer circuits coupled to receive the first OCT calibration code.

13. The integrated circuit defined in claim 9 wherein the on-chip termination calibration block generates a second on-chip termination (OCT) calibration code that controls conductive states of first pull-down transistors in the on-chip termination calibration block, the first bit shifter circuit is configured to shift the second OCT calibration code to generate a third bit shifted code that controls a termination impedance provided by second pull-down transistors in the first buffer, and the second bit shifter circuit is configured to shift the second OCT calibration code to generate a fourth bit shifted code that controls a termination impedance provided by third pull-down transistors in the second buffer.

14. The integrated circuit defined in claim 13 wherein the first bit shifter circuit comprises a first plurality of multiplexers, and the second bit shifter circuit comprises a second plurality of multiplexers.

15. The integrated circuit defined in claim 9 wherein the first bit shifter circuit and the second bit shifter circuit each comprise a shift register circuit.

16. The integrated circuit defined in claim 15 wherein the shift register circuit in each of the first and the second bit shifter circuits comprises a serial-to-parallel converter having a plurality of storage circuits.

17. The integrated circuit defined in claim 9 wherein the first bit shifter circuit is configured to shift the OCT calibration code by two bits.

18. A method for adjusting an on-chip termination impedance on an integrated circuit, the method comprising:
providing a first on-chip termination (OCT) calibration code to an input/output (IO) bank on the integrated circuit, wherein the first OCT calibration code controls conductive states of first pull-up transistors in a calibration block;
bit shifting the first OCT calibration code using a first bit shifter circuit in the IO bank to generate a first bit shifted output code;
bit shifting the first OCT calibration code using a second bit shifter circuit in the IO bank to generate a second bit shifted output code;
controlling a termination impedance provided by second pull-up transistors in a first buffer in the IO bank in response to the first bit shifted output code; and
controlling a termination impedance provided by third pull-up transistors in a second buffer in the IO bank in response to the second bit shifted output code.

19. The method defined in claim 18 wherein bit shifting the first OCT calibration code using the first bit shifter circuit further comprises bit shifting the first OCT calibration code using a first plurality of multiplexers, and wherein bit shifting the first OCT calibration code using the second bit shifter circuit further comprises bit shifting the first OCT calibration code using a second plurality of multiplexers.

20. The method defined in claim 18 further comprising:
bit shifting the first OCT calibration code using a third bit shifter circuit to generate a third bit shifted output code;
bit shifting a second OCT calibration code using a fourth bit shifter circuit to generate a fourth bit shifted output code;
controlling a termination impedance of fourth pull-up transistors in a third buffer in the IO bank in response to the third bit shifted output code; and
controlling a termination impedance of pull-down transistors in the third buffer in response to the fourth bit shifted output code.

21. The method defined in claim 18 further comprising:
providing a second on-chip termination (OCT) calibration code to the IO bank that controls conductive states of first pull-down transistors in the calibration block;
bit shifting the second OCT calibration code using the first bit shifter circuit to generate a third bit shifted output code;
bit shifting the second OCT calibration code using the second bit shifter circuit to generate a fourth bit shifted output code;

controlling a termination impedance provided by second pull-down transistors in the first buffer in response to the third bit shifted output code; and controlling a termination impedance provided by third pull-down transistors in the second buffer in response to the fourth bit shifted output code, wherein the first and the second buffers share a same power supply voltage.

22. A method for adjusting an on-chip termination impedance on an integrated circuit, the method comprising:

generating a first on-chip termination calibration code;

adjusting the first on-chip termination calibration code to generate a first adjusted code using circuitry in an input/output (IO) bank;

controlling a first on-chip termination impedance in the IO bank provided by first pull-down transistors in a first buffer at a first pin in response to the first adjusted code;

adjusting the first on-chip termination calibration code to generate a second adjusted code using circuitry in the IO bank; and controlling a second on-chip termination impedance in the IO bank provided by second pull-down transistors in a second buffer at a second pin in response to the second adjusted code, wherein the first and the second buffers share a same power supply voltage.

23. The method defined in claim 22 further comprising:

generating a second on-chip termination calibration code that control conductive states of first pull-up transistors in the calibration block;

adjusting the second on-chip termination calibration code to generate a third adjusted code using circuitry in the IO bank;

controlling a third on-chip termination impedance in the IO bank provided by second pull-up transistors in the first buffer at the first pin in response to the third adjusted code;

adjusting the second on-chip termination calibration code to generate a fourth adjusted code using circuitry in the IO bank; and controlling a fourth on-chip termination impedance in the IO bank provided by third pull-up transistors in the second buffer at the second pin in response to the fourth adjusted code.

24. The method defined in claim 22 wherein adjusting the first on-chip termination calibration code to generate the first adjusted code using circuitry in the IO bank further comprises shifting the first on-chip termination calibration code using a first bit shifter circuit to generate the first adjusted code, and adjusting the first on-chip termination calibration code to generate the second adjusted code using circuitry in the IO bank further comprises shifting the first on-chip termination calibration code using a second bit shifter circuit to generate the second adjusted code.

25. The method defined in claim 24 wherein shifting the first on-chip termination calibration code using the first bit shifter circuit further comprises shifting the first on-chip termination calibration code using a first plurality of multiplexers, and shifting the first on-chip termination calibration code using the second bit shifter circuit further comprises shifting the first on-chip termination calibration code using a second plurality of multiplexers.

\* \* \* \* \*